United States Patent [19]

Kimura

[11] Patent Number: 5,737,052
[45] Date of Patent: Apr. 7, 1998

[54] LIQUID CRYSTAL DISPLAY AND MANUFACTURING PROCESS THEREOF WITH DRIVE CIRCUIT AND ACTIVE MATRIX CONNECTED VIA THROUGH HOLE

[75] Inventor: Atsuo Kimura, Ohtsu, Japan

[73] Assignee: International Business Machines Corporation, Armonk, N.Y.

[21] Appl. No.: 568,454

[22] Filed: Dec. 7, 1995

[30] Foreign Application Priority Data

Dec. 7, 1994 [JP] Japan ............... 6-303728

[51] Int. Cl.⁶ ............... G03F 1/1345; H01L 29/40
[52] U.S. Cl. ............... 349/149; 349/151; 257/621
[58] Field of Search ............... 349/149, 151; 257/621

[56] References Cited

U.S. PATENT DOCUMENTS

| | | | |
|---|---|---|---|
| 3,343,256 | 9/1967 | Smith et al. | 257/621 |
| 3,462,650 | 8/1969 | Hennings et al. | 257/621 |
| 4,008,564 | 2/1977 | Luce et al. | 349/151 |
| 4,824,215 | 4/1989 | Joseph et al. | 349/149 |
| 5,463,246 | 10/1995 | Matsunami | 257/621 |
| 5,510,915 | 4/1996 | Ge et al. | 349/149 |
| 5,537,234 | 7/1996 | William et al. | 349/149 |

FOREIGN PATENT DOCUMENTS 1-185943  7/1989  Japan .................. 257/621

OTHER PUBLICATIONS

IBM Technical Disclosure Bulletin, Wu, "Wafer Structure Permitting Distribution from the Back Side of the Wafer", pp. 2898–9 vol. 16, No. 9, Feb. 1974.

Primary Examiner—Anita Pellman Gross
Attorney, Agent, or Firm—Ronald L. Drumheller

[57] ABSTRACT

A liquid crystal display is provided which reduces the substrate cost and shortens the wiring length to drive elements thereby decreasing wiring resistance and load on the drive power supply. A pixel array board is also provided, as well as a manufacturing process and a method for forming an image with the pixel array board. A silicon substrate 1 is used as an LCD pixel array. A through hole is formed in the silicon substrate 1 by means of anisotropic etching or the like. Formed in the through hole are an insulating layer 5 and a wiring conductor layer (for example, Cr—Cu—Au layer) 8 with a predetermined pattern. The wiring conductor layer 8 is bonded to a conductor layer (for example, Cr—Cu—Au layer) 8' of a drive element 10 through a solder layer 9, or by means of thermo-compression bonding between the Cr—Cu—Au layer 8 and the Cr—Cu—Au layer 8' to connect the LCD pixel array on the surface of silicon substrate 1 to the drive element 10 and the like on the bottom of silicon substrate 1.

4 Claims, 6 Drawing Sheets

LIQUID CRYSTAL DISPLAY AND MANUFACTURING PROCESS THEREOF WITH DRIVE CIRCUIT AND ACTIVE MATRIX CONNECTED VIA THROUGH HOLE

BACKGROUND OF THE INVENTION

1. Field of the Invention

The present invention relates to a liquid crystal display, its manufacturing process, and a method for forming an image, and, more particularly, to a reflective liquid crystal display suitable for reducing the cost of the substrate when a silicon substrate is used as an LCD pixel array board, and for lowering the load on a drive power source together with decreasing wiring resistance at the same time, a process for manufacturing it, and a method for forming an image.

2. Related Art

A conventional liquid crystal display (LCD) has a pixel array board 21 disposed on a silicon wafer 20 as shown in FIG. 10. Drive elements (drivers) 23 to control the pixel are disposed immediately above anisotropic conductive films (ACFs) 22, and connected to pixels through the ACFs 22. The anisotropic conductive film has characteristics that exhibit conductivity in response to action of pressure. With such characteristics, the pixels on the pixel array board 21 can be electrically connected to the drive elements 23.

However, the liquid crystal display with such arrangement has required wiring 24 for connecting the pixel array board 21 to the ACFs 23, which has consumed the area of silicon wafer 20. The state where the wiring 24 occupies some area of the silicon substrate 21 is called "fan-out." Occupation of a large area of silicon substrate by the fan-out has been one of major obstacles in reducing the cost of pixel array board 21. In addition, wiring length from the pixel array board 21 to the ACFs 23 disposed therearound has been rather long so that resistance in wiring has been high, which demands a higher capacity to a power supply.

SUMMARY

The objective on purpose of the present invention is to provide a liquid crystal display which can reduce the substrate cost and shorten the wiring length to drive elements thereby decreasing wiring resistance and load on the drive power supply, and, more particularly, a pixel array board for it and its manufacturing process, and a method for forming an image with the pixel array board.

To attain the above object, the liquid crystal display of the present invention electrically connects a pixel array for the liquid crystal display on a first surface of a substrate to a drive element on a second surface of the substrate through a conductive layer formed on a through hole provided in the substrate. The substrate is desirably composed of silicon or glass. In addition, it is desirable that the through hole is provided with a side wall with a slope expanding along the second surface of the substrate in the thickness of the substrate.

In addition, to attain the above object, the manufacturing process of the liquid crystal display of the present invention comprises steps of forming a through hole in a silicon substrate, forming wiring conductors on the through hole, and connecting an LCD pixel array on a surface of the silicon substrate and a drive element mounted on the other surface of the silicon substrate. In addition, the through hole is desirably formed in the silicon substrate by anisotropic etching. It is also desirable to perform the anisotropic etching by placing an etch stopper on the surface of the silicon substrate in forming the through hole in the silicon substrate. Furthermore, it is desirable that the etch stopper is composed of a Si oxide film or a Si nitride film.

Furthermore, the present invention forms an image by converting natural light emitted from a light source into linearly polarized light by using the pixel array board for the liquid crystal display, having it reach the surface of pixel array for the liquid crystal display, adjusting orientation of liquid crystal on pixel basis through drive elements by control voltage so as to change intensity of light reflected from the pixel array for the liquid crystal display. It is desirable to enlarge the image through lens and mirrors for projection on a screen through lens and mirrors.

Since a silicon substrate is used for an LCD pixel array, a wiring conductor layer in the through hole provided on the silicon substrate can be utilized as wiring for electrically connecting the LCD pixel array and drive elements, the drive elements and the like can be disposed on the rear (or back) surface of the silicon substrate instead of disposing them around on the front surface of the silicon substrate, thereby reducing the area of silicon substrate and shortening the wiring length so that load on the drive power supply can be reduced.

DESCRIPTION OF THE PREFERRED EMBODIMENT

Figure 1:
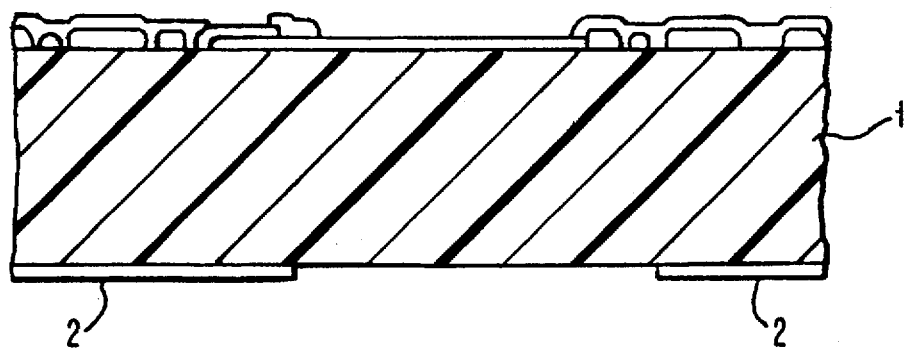
FIG. 1 is a sectional view of an essential part for illustrating deposition of a mask on a substrate in the manufacturing process of a pixel board for a liquid crystal display of the present invention.

An embodiment of the present invention will be explained in the following with reference to the drawings. The embodiment is an example where single crystal silicon is used as the substrate. FIGS. 1 to 7 are sectional views of an essential part illustrating an embodiment of a manufacturing process for the liquid crystal display device of the present invention in the sequence of process, respectively. Referring to FIG. 1, a mask 2 consisting of an insulating material is deposited on the bottom surface of a silicon (Si) substrate 1. In this case, an Si nitride film ($Si_3N_4$), for example, is used as the mask 2 consisting of an insulating material. An etch stopper 3 is provided on the surface opposite to the surface deposited with the mask 2 (top surface of the substrate 1). An Si oxide or Si nitride film, for example, is used as the etch stopper 3.

Then, a through hole 4 is formed by etching the bottom surface of the substrate 1. Sand blasting, laser grinding, or etching with KOH or the like may be applied as the method for forming the through hole 4. The etching with KOH or the like has excellence in uniformity, reproducibility and etch rate in forming the through hole.

Figure 2:
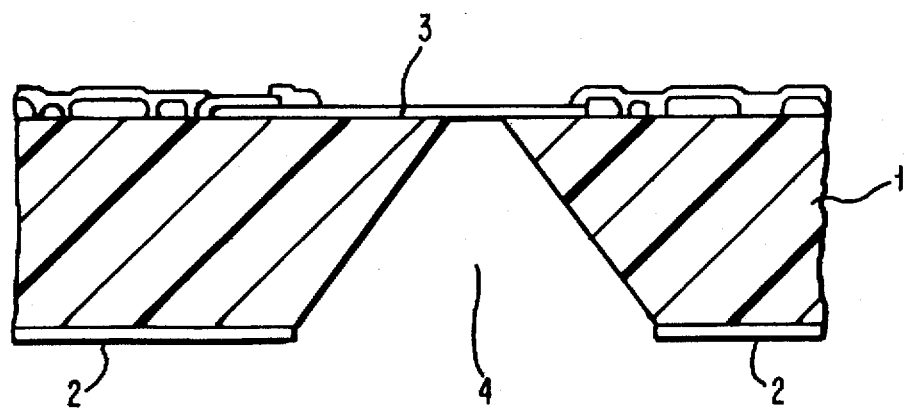
FIG. 2 is a sectional view of an essential part for illustrating etching for forming a through hole in the manufacturing process of a pixel board for a liquid crystal display of the present invention.

FIG. 2 shows the through hole 4 formed by the etching with KOH or the like. The through hole 4 is formed with a side wall having a slope expanding along the bottom surface of the substrate 1 in the thickness of the substrate 1. For example, when the etching is performed from the bottom surface of the substrate 1 with (100) plane, a side wall having (111) plane with a slope of 54.7 degrees can be easily formed.

In the etching, it is possible to make a very small area of the through hole 4 consumed by the silicon surface just below the etch stopper 3. While the through hole 4 may be formed by either anisotropic or isotropic etching, anisotropic etching can provide better step coverage for wiring in the through hole 4.

After the through hole 4 is formed by the etching, the etch stopper 3 is removed. In removing the etch stopper 3, etchant containing, for example, $HF/HNO_3/H_2O$ is used. The etchant removes the etch stopper 3 together with the mask 2.

Figure 3:
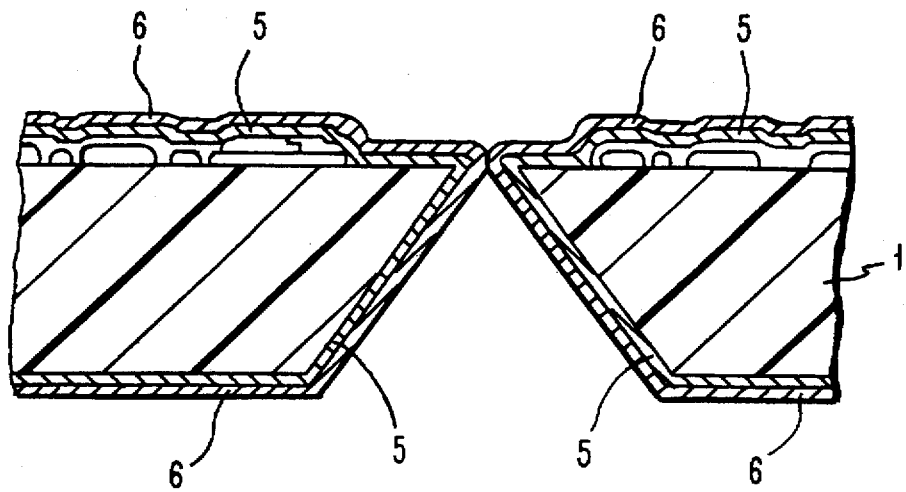
FIG. 3 is a sectional view of an essential part for illustrating formation of an insulating layer and Cr seed layer on the through hole in the manufacturing process of a pixel board for a liquid crystal display of the present invention.

Then, as shown in FIG. 3, an insulating layer 5 is deposited on the substrate 1 including the side wall of the through hole 4 to provide wiring in the through hole 4. An Si oxide or Si nitride film, for example, is used as the insulating layer 5. Cr 6 is then deposited on the entire surface of the insulating film 5. Cr 6 serves as a seed layer for a Cu—Au layer which is deposited on the surface of Cr 6.

Figure 4:
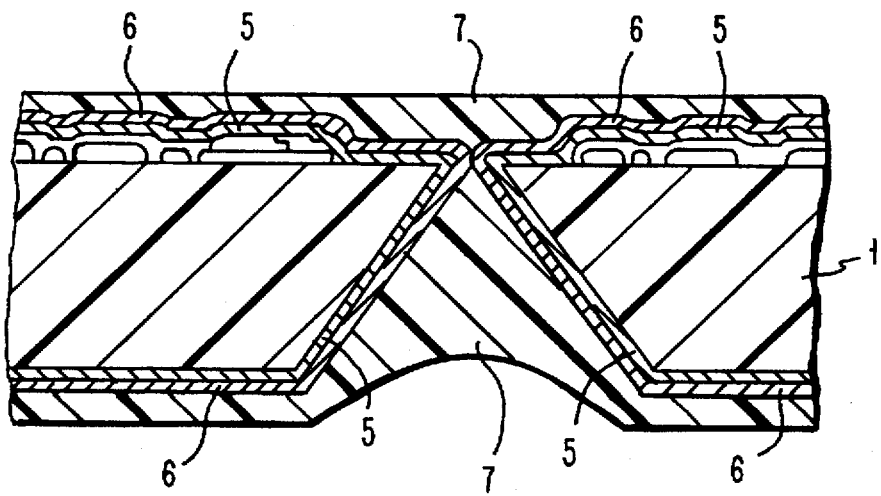
FIG. 4 is a sectional view of an essential part for illustrating formation of a photosensitive resin layer on the substrate including inside the through hole in the manufacturing process of a pixel board for a liquid crystal display of the present invention.

Then, as shown in FIG. 4, photosensitive resin 7 such as photoresist or polyimide is coated on both surfaces of the substrate 1, and thermally cured. The heat treatment in this case is to enhance the adhesive property of the photosensitive resin 7 to the Cr 6.

Figure 5:
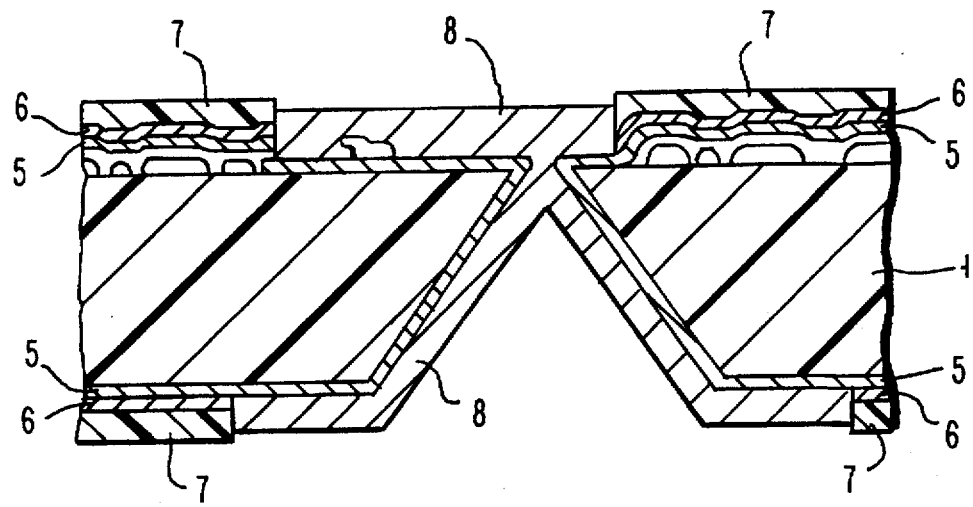
FIG. 5 is a sectional view of an essential part for illustrating formation of a conductor layer to the through hole in the manufacturing process of a pixel board for a liquid crystal display of the present invention.

Thereafter, as shown in FIG. 5, the photosensitive resin 7 is exposed while it is masked. The exposed and photo-cured photosensitive resin 7 is left, and other regions of the photosensitive resin 7 is removed. When Cu—Au is deposited in such state by vapor deposition, sputtering, or plating, a Cr—Cu—Au layer 8 is formed by using Cr 6 deposited on the surface of insulating layer 5 as the seed.

Figure 6:
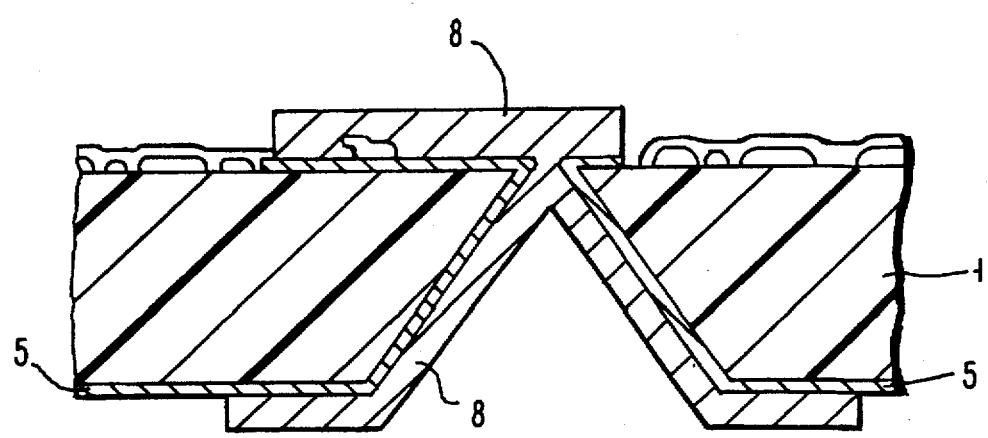
FIG. 6 is a sectional view of an essential part for illustrating a state where the photosensitive resin and Cr are removed in the manufacturing process of a pixel board for a liquid crystal display of the present invention.

Then, as shown in FIG. 6, the Cr 6 and the photosensitive resin 7 are removed, which do not contribute to wiring.

Figure 7:
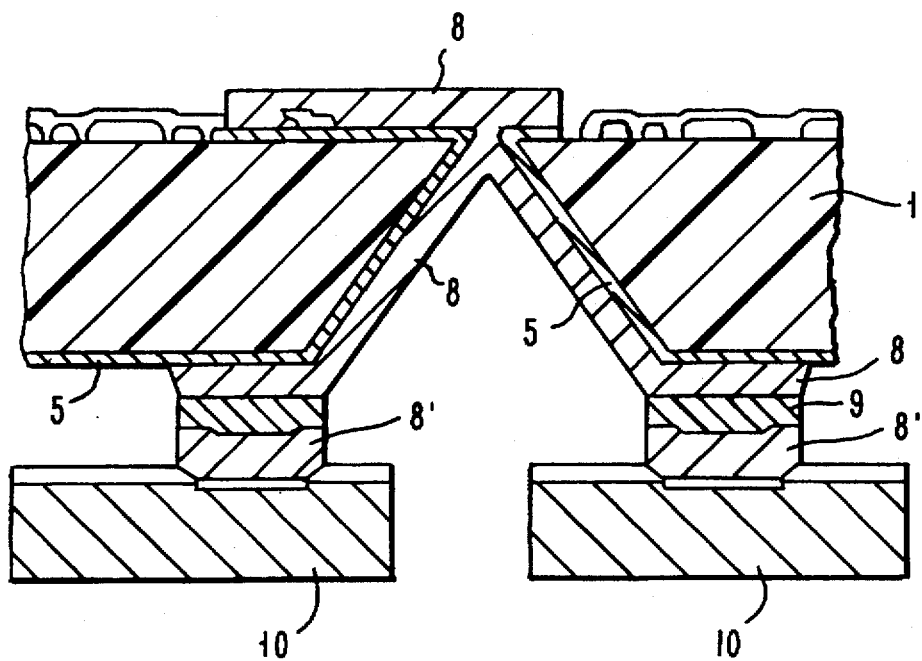
FIG. 7 is a sectional view of an essential part for illustrating bonding with a drive element on the bottom of substrate in the manufacturing process of a pixel board for a liquid crystal display of the present invention.

Thus, a wiring layer necessary for the substrate and a driving LSI is formed. On the bottom surface of the substrate 1, as shown in FIG. 7, the Cr—Cu—Au layer 8 is bonded to a Cr—Cu—Au layer 8' on the drive element 10 through a solder layer 9 (for example, Pb/Sn). The Cr—Cu—Au layer 8 on the top surface of the substrate 1 is connected to the pixel array also on the surface of the substrate 1. In this manner, the drive element 10 is connected to the pixel array on the surface of the substrate 1 through the Cr—Cu—Au layer 8', the solder layer 9, and the Cr—Cu—Au layer 8 formed on the side wall of the through hole 4.

Although, in the embodiment described above, an example using photosensitive polyimide which requires less number of process steps is illustrated for patterning in FIG. 5, the present invention may be applied to a case where photoresist is used together with non-photosensitive polyimide.

In addition, although FIG. 7 shows an example where the Cr—Cu—Au layer 8 is bonded to the Cr—Cu—Au layer 8' through the solder layer 9 such as Pb/Sn, the present invention may bond the Cr—Cu—Au layer 8 and the Cr—Cu—Au layer 8' through thermo-compression bonding (Au—Au).

Although, in the above-mentioned formation of pixel board, there is shown an example where a silicon substrate is used as a substrate for the pixel board, a glass substrate may be used instead. Even in the case of glass substrate, basic manufacturing process is same as in the silicon substrate. However, in forming the through hole in the glass substrate, it is desirable to apply dry etching using sand blasting or laser to the anisotropic etching with slope. In wet etching, mixture of nitric acid and hydrofluoric acid, or diluted hydrofluoric acid is used as etchant. When such etchant is used, silicon nitride is used as the etch stopper.

Figure 8:
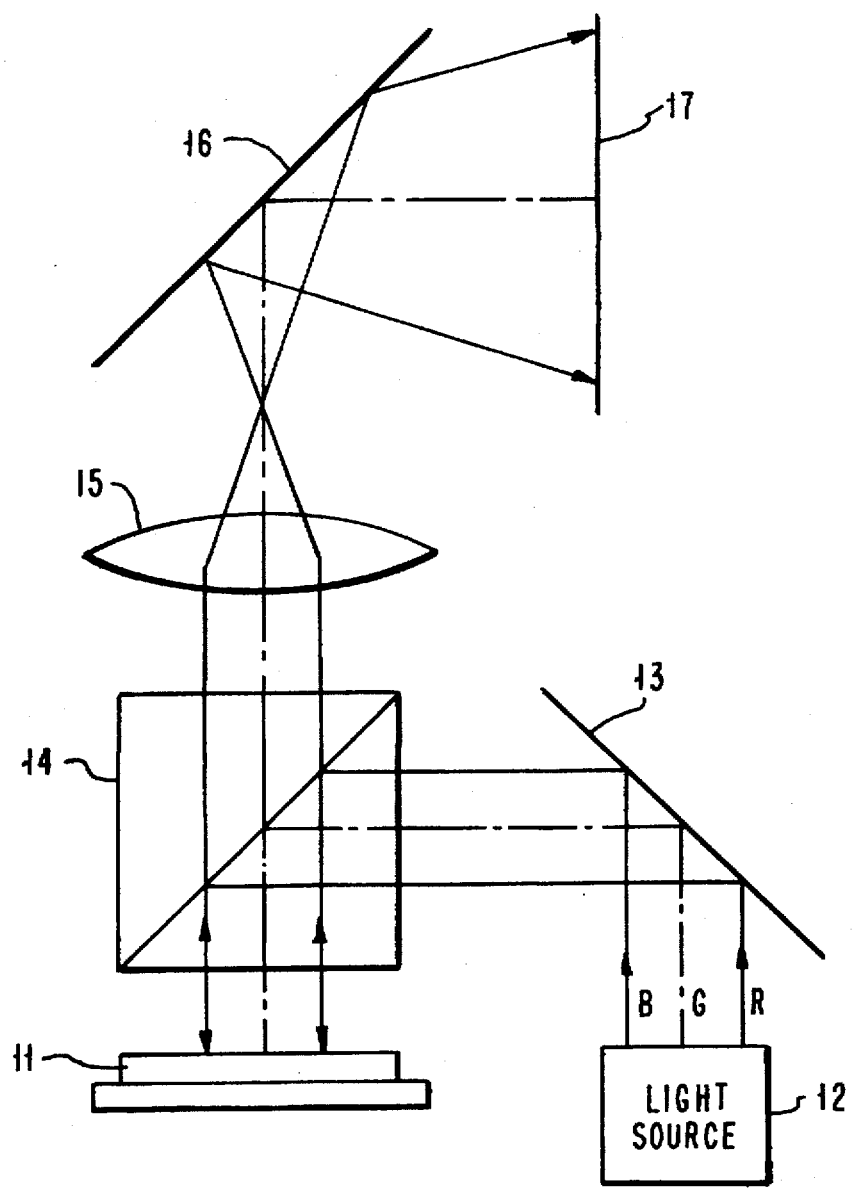
FIG. 8 is a diagram for illustrating how to form an image by using the pixel array board of the liquid crystal display of the present invention.

The pixel board for liquid crystal display thus produced can be used, for example, for a liquid crystal light valve (LCLV) in a reflective liquid crystal projection system as shown in FIG. 8. In the figure, natural light emitted from a light source 12 and reflected by a dichroic mirror 13 is converted into linearly polarized light by a polarization beam splitter (PBS) 14 and reaches the pixel board 11.

The pixel board 11 changes intensity of light being reflected by adjusting orientation of liquid crystal on pixel basis with control voltage to produce an image. The image thus produced is expanded through a lens 15 and a mirror 16, and projected onto a screen 17. While an example where the image from the pixel board 11 is expanded is illustrated here, the pixel region may be directly used as an image display when the pixel board 11 is formed in a large size.

Figure 9A:
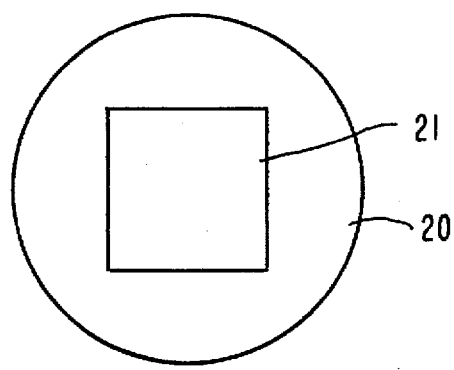
FIG. 9 is diagrams illustrating the state of the top and bottom surfaces of the silicon substrate in the liquid crystal display of the present invention.
Figure 9B:
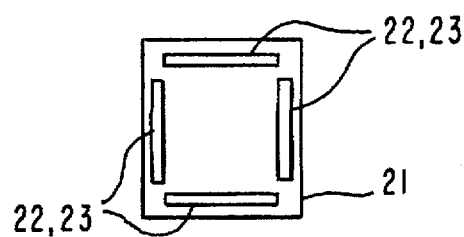
Figure 10:
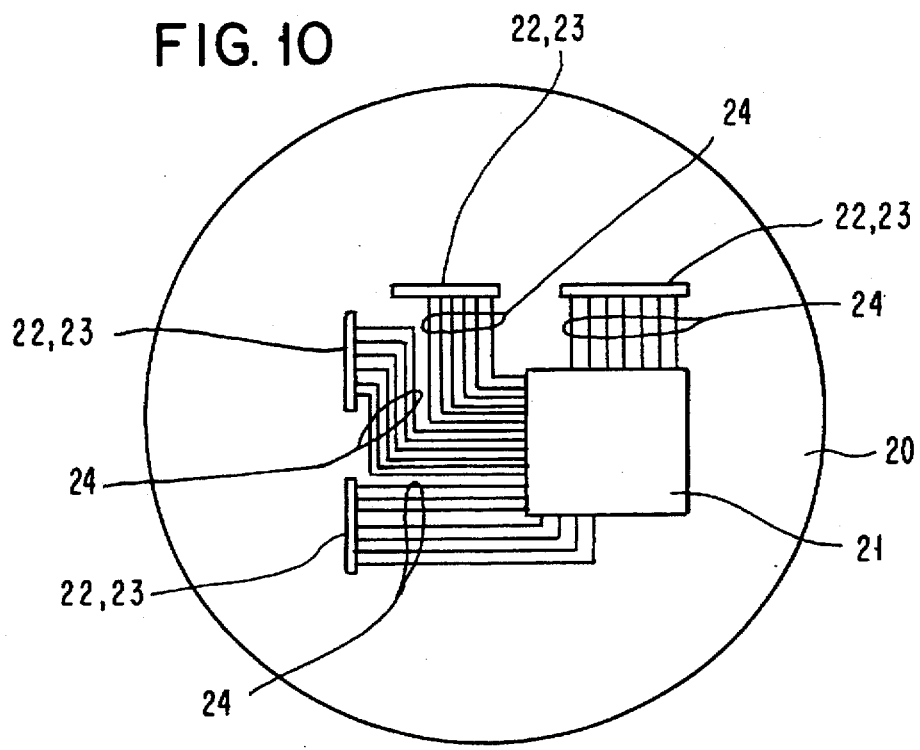
FIG. 10 is a diagram illustrating the state of the top and bottom surfaces of the silicon substrate in a conventional liquid crystal display.

FIG. 9 shows an example of liquid crystal display of the present invention. FIG. 9 (A) is a top surface of it, while FIG. 9 (B) is the bottom of pixel board. In FIG. 9 (B), the ACF 22 and the drive element 23 are disposed on the bottom surface of the pixel board 21 rather than around it. Accordingly, this liquid crystal display does not have the arrangement and wiring of the ACF 22 and the drive element 23 as shown in FIG. 10 so that the area of silicon wafer 20 is significantly smaller than that of silicon wafer 20 shown in FIG. 10.

As described, according to the present invention, since it becomes possible the drive element to be disposed on the bottom surface, whereby the area necessary for fan-out extending around the pixel array becomes unnecessary. In addition, it becomes possible to directly connect the drive element with bump to the pad formed on the bottom of the pixel array board with thermo-compression bonding or reflow of solder thereby eliminating the ACF so that the cost can be further reduced.

What is claimed is:

1. A liquid crystal display, comprising:
  a liquid crystal pixel board comprising a silicon substrate having first and second opposed surfaces and a liquid crystal pixel array disposed on the first surface of the substrate;
  at least one via through hole connecting the first and second surfaces of the substrate; and at least one driver element for addressing the liquid crystal pixel array, the at least one driver element being bonded to the second surface of the substrate and being connected electrically to the liquid crystal pixel array by a conducting layer formed on said at least one via through hole.

2. A liquid crystal display as defined in claim 1 wherein the at least one driver element is an integrated circuit fabricated separately from the liquid crystal pixel array.

3. A manufacturing process for a liquid crystal display, comprising steps of: forming a through hole in a silicon substrate connecting opposing surfaces thereof, forming wiring conductors on said through hole and extending to both of said surfaces, mounting an LCD pixel array on one of the surfaces of the silicon substrate and in contact with the wiring conductors, and mounting a drive element for addressing the LCD pixel array on the other one of the surfaces of the silicon substrate and in contact with the wiring conductors.

4. A method of forming a liquid crystal display, comprising the steps of:

forming a liquid crystal pixel board comprising a silicon substrate having first and second opposed surfaces and a liquid crystal pixel array disposed on the first surface of the substrate;

forming at least one via through hole in the substrate connecting the first and second surfaces thereof;

forming at least one driver element for addressing the liquid crystal pixel array, the at least one driver element being formed as an integrated circuit separately from the liquid crystal pixel array; and bonding the at least one driver element to the second surface of the substrate and electrically connecting the liquid crystal pixel array to the at least one driver element by a conducting layer formed on the at least one via through hole.

* * * * *